United States Patent [19]

Trammell, Jr.

[11] Patent Number: 4,525,664
[45] Date of Patent: Jun. 25, 1985

[54] ELECTRONIC FUSE TESTER

[75] Inventor: Earl M. Trammell, Jr., St. Louis, Mo.

[73] Assignee: Bek-Tech Products Incorporated, St. Louis, Mo.

[21] Appl. No.: 455,193

[22] Filed: Jan. 3, 1983

Related U.S. Application Data

[63] Continuation-in-part of Ser. No. 354,381, May 3, 1982.

[51] Int. Cl.³ ............................................. G01R 19/14
[52] U.S. Cl. ....................................... 324/51; 324/133
[58] Field of Search ........................... 337/241; 81/3.8; 324/158 F, 51, 52, 133

[56] References Cited

U.S. PATENT DOCUMENTS

| 925,412 | 6/1909 | Addie | 324/51 |
|---|---|---|---|
| 1,109,450 | 9/1914 | Mitchell | 324/51 |
| 1,638,438 | 8/1927 | Gottschalk | 324/51 |
| 2,023,916 | 12/1935 | Dante | 324/51 |
| 2,074,921 | 3/1937 | Kauffman . | |
| 2,492,302 | 12/1949 | Linton . | |
| 2,744,237 | 5/1956 | Polcutch | 324/51 |
| 3,071,760 | 1/1963 | Glueckert . | |
| 3,457,535 | 7/1969 | Poehlman . | |
| 4,012,097 | 3/1977 | Long | 324/158 F |
| 4,360,780 | 11/1982 | Skutch | 324/158 F |

FOREIGN PATENT DOCUMENTS

| 2060884 | 6/1972 | Fed. Rep. of Germany . |
| 2831139 | 1/1980 | Fed. Rep. of Germany . |
| 7503428 | 9/1976 | Netherlands . |

Primary Examiner—Stanley T. Krawczewicz
Assistant Examiner—Jose M. Solis
Attorney, Agent, or Firm—Rogers, Howell, Renner, Moore & Haferkamp

[57] ABSTRACT

An electronic hand held fuse tester includes an elongated handle member to facilitate grasping of the device during use, a housing member integrally formed at one end of the handle, the housing member enclosing an electronic test circuit with light emitting diodes mounted to a PC board, the PC board mounted within the housing to a pair of pivotally mounted contact members, the contact members adapted to contact the ends of the fuse to be tested, and fixtures at the other end of the handle member to facilitate removal and insertion of replacement fuses.

18 Claims, 8 Drawing Figures

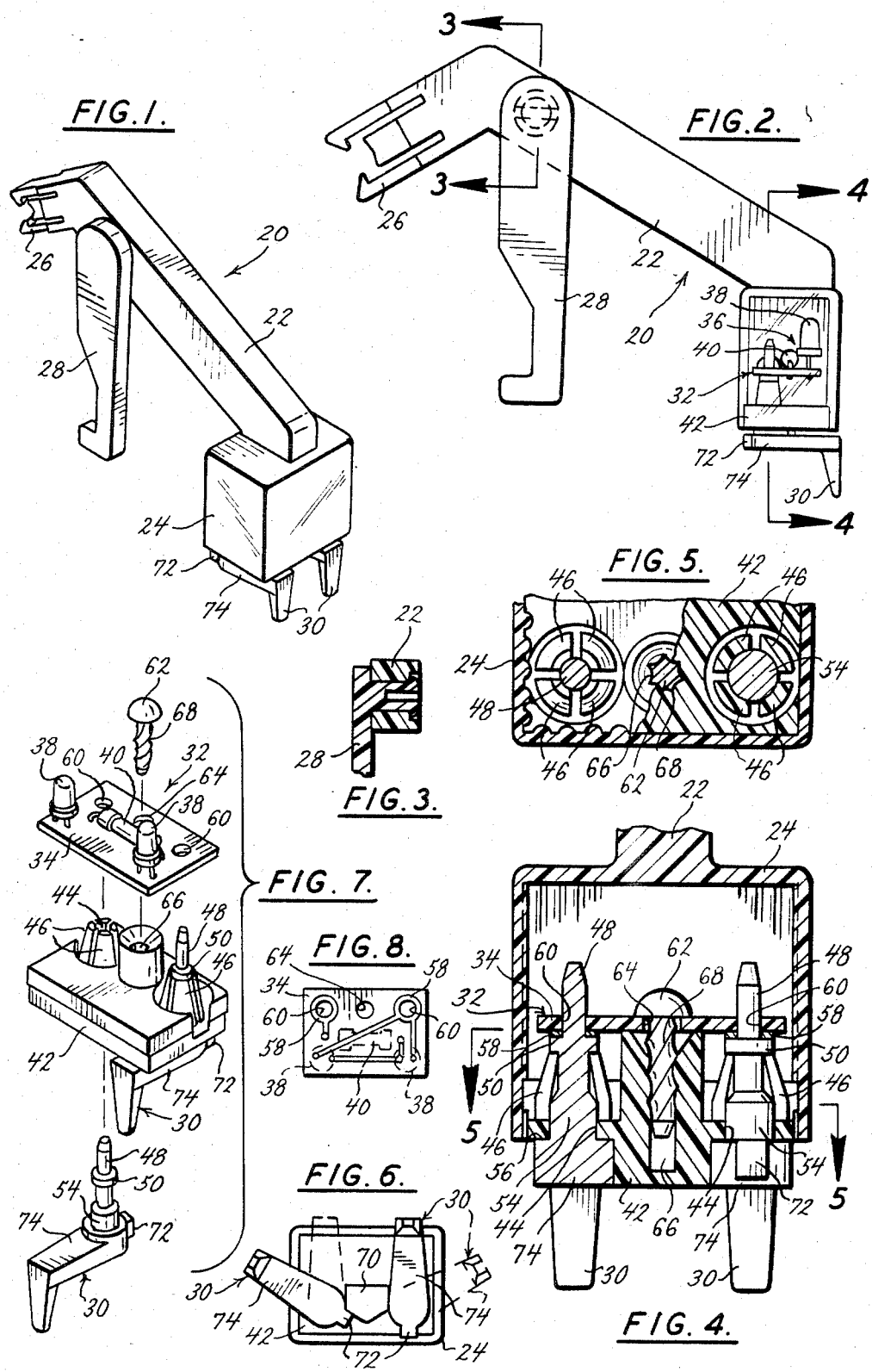

ELECTRONIC FUSE TESTER

This application is a continuation in part of Ser. No. 354,381 filed May 3, 1982.

BACKGROUND AND SUMMARY

Fuses have been used for many years to provide over current and short circuit protection for electrical circuits. Frequently, fuses are grouped and mounted in fuseblock assemblies such that when one fuse blows, it must be identified from among the group before it can be replaced.

There are many devices in the prior art which have been developed to aid in the detection of a blown fuse by providing a visual or audible indication upon failure of a fuse. Examples of these of which the inventor herein is aware include Linton U.S. Pat. No. 2,492,302 which discloses a fuse indicator which clips on to the fuse barrel and extends from one end terminal to the other and which lights up to indicate a blown fuse; Poehlman U.S. Pat. No. 3,457,535 is a similar device which has pigtail conductors to provide adjustability; Glueckert U.S. Pat. No. 3,071,760 discloses a plug in fuse with a built in alarm circuit that provides an audible signal upon fuse rupture; Kauffman U.S. Pat. No. 2,074,921 discloses a device for attachment to barrel type fuses which provides a visual signal upon fuse failure and also a mechanical means to handle the fuse; German Pat. No. 28-31-139 discloses a fuse monitoring circuit which includes light emitting diodes (LED); and Dutch Pat. No. 7503-428 which also discloses a fuse indicating circuit incorporating LED's.

Although these prior art devices generally disclose the concept of providing an indication when a fuse blows, there is neither disclosed nor suggested a pocket-size, hand held testing device which has adjustable contact members for testing fuses of varying length and which can be inexpensively produced in injection molded plastic parts which require little assembly to produce a finished device. The inventor herein has succeeded in developing such a device with a translucent housing with LED's at one end, and one which has fixtures at the other end of the handle to facilitate removal of the blown fuse, and insertion of a replacement fuse. Thus, the invention includes a handle member with an integrally formed translucent housing at one end thereof and which receives a base plate having structure to receive and mount a PC board in contact with pivotally mounted contact members, the PC board having LED's mounted thereon to illuminate and indicate a blown fuse when the contact members are touched to the fuse clips or terminals at either end of the fuse. At the opposite end of the handle member is an integrally formed fixture for blade type fuses as disclosed in parent application Ser. No. 354,381 filed May 3, 1982, the disclosure of which is incorporated herein by reference, as well as a hook shaped member which is snapped into the handle member and which can pivot about the handle member for removing barrel type fuses. All of the pieces comprising the device are plastic injection molded, except for the PC board and its circuit, the drive pin which mounts the PC board, and the pivotal contact members.

One of the unique features of the invention includes the ability to pivotally mount each contact member to the base plate and PC board so that the contact members may be adjusted for different size fuses without losing electrical contact with the PC board and circuit. Each contact member has a post which extends through a hole in the PC board, the PC board being pressure fit against the contact member posts by a knurled drive pin which is inserted through another hole in the PC board and into the base plate. The contact members can thus maintain their electrical contact with the circuit of the PC board as they pivot with respect to each other and with respect to the tool. This permits the contact members to be freely moved to bridge across various sized fuses and test them. On the bottom of the base plate is a pentagon shaped stop which contacts a nib on each contact member to limit movement of the contact members and prevent their coming in contact with each other.

This new invention provides many advantages over the fuse indicators of the prior art through its inexpensive construction, ease of assembly, unique feature of pivoting contact members and the means of maintaining them in electrical contact with the PC board indicator circuit, the stop means to prevent electrical shorting of the contact members, the knurled drive pin which provides contact pressure between the PC board and the contact members, the pair of fixtures at the other end of the handle for removal and insertion of fuses, and all of these features being packaged in a pocket sized tool.

A brief description has been given to facilitate an understanding of the invention. The invention may be more fully understood by studying the drawings and the description of the preferred embodiment which follows.

BRIEF DESCRIPTION OF THE DRAWINGS

FIG. 1 - is an isometric view of the invention;

FIG. 2 - is a side view of the invention with a partial cutaway to show the housing interior;

FIG. 3 - is a partial cross sectional view taken along the plane of line 3—3 in FIG. 2 and detailing the swivel mounting for the barrel type fuse removal tool;

FIG. 4 - is a partial cross sectional view taken along the plane of line 4—4 in FIG. 2 and detailing the PC board, contact member, and base plate assembly mounted within the housing;

FIG. 5 - is a cross sectional view taken along the plane of line 5—5 in FIG. 4 and detailing the swivel mounting of the contact members and the PC board to the housing base plate;

FIG. 6 - is a bottom view of the base plate with contact members shown in phantom to depict the limits of their pivoting movement;

FIG. 7 - is an exploded view of the contact member, base plate, and PC Board assembly; and FIG. 8 - is a bottom view of the PC board which depicts the circuitry thereof.

DETAILED DESCRIPTION OF THE PREFERRED EMBODIMENT

The electronic fuse tester 20 of the present invention as shown in FIG. 1 includes an elongated handle member 22 with an integrally formed housing 24 at one end thereof, a blade type fuse fixture 26 integrally formed at the other end thereof, and a puller arm 28 pivotally mounted to the handle member 22. The blade type fuse fixture 26 and puller arm 28 are more specifically disclosed and described in the parent application mentioned above. Two contact members 30, which may be made of diecast zinc to enhance their electrical conductivity, are pivotally mounted to the housing 24, as will be further described below. As shown in FIG. 2, the housing 24 provides the mounting for a PC board assembly 32, the PC board assembly 32 including the board 34 and the circuit elements 36 which comprise the test circuit which illuminates in response to a voltage applied between contact members 30. Circuit elements 36 include parallel connected LED's 38 and a current limit resister 40, as is known in the art.

As shown in greater detail in FIGS. 4, 5 and 7, a base plate 42 mounts the PC board assembly 32 and contact members 30, and then the entire assembly is mounted within the housing 24. Contact members 30 are pivotally mounted to the base plate 42 by being inserted through holes 44 having a plurality of upstanding ridges 46. The post 48 of contact member 30 has a knurl 50 which separates the ridges 46 as the post 48 is inserted therethrough, the ridges 46 snapping back into place as the knurl 50 is pushed through hole 44. The post 48 has an enlarged portion 54 and shoulder 56 which abutts the bottom of base plate 42 to provide a seating of the contact member 30 as it is inserted into the hole 44 and pivotally mounted to base plate 42.

The PC board assembly 32, as best shown in FIG. 8, includes a pair of annular contact surfaces 58 with holes 60 extending therethrough to match and line up with the post 48 of contact members 30, and especially the top of knurls 50 which form the matching contact surfaces of contact members 30. Thus, the PC board assembly 32 fits down over the posts 48 such that the contact surfaces 58 rest upon the knurls 50. Contact pressure is provided by the insertion of a knurled drive pin 62 through a hole 64 in PC board 34 and into aperture 66 in base plate 42, the knurled shank 68 cutting into the sidewall of aperture 66 to provide a locking fit and prevent loosening of drive pin 62 after its insertion. Although not specifically depicted in the drawings, drive pin 62 is driven sufficiently deep into aperture 66 to create a slight bowing of the board member 34 and thus contact pressure between contact surfaces 58 and knurls 50 to insure good electrical contact as the contact members 30 pivot to accomodate various sized fuses. As best shown in FIG. 4, after the base plate assembly as shown in FIG. 7 is completed, the entire assembly may be mounted to the housing 24 and held in place through the use of solvents or the like, as is known in the art.

As shown in FIG. 6, the pivoting action of contact members 30 is limited by a stop 70 integrally formed on the bottom of base plate 42 and which assumes a pentagon like shape. Each contact member 30 has a nib 72 which contacts a surface of the stop 70 as it reaches one limit of its pivoting motion. At the other limit of its motion, the arm 74 of contact member 30 abutts another surface of stop 70. The limits of movement of each contact member 30 are shown in FIG. 6, and it is noted that stop 70 eliminates the possibility of shorting the contact members 30 together. This helps prevent electrical damage to the fuse tester 20 and also avoids a dangerous condition should there be a short circuit in the circuit being tested. This structural safety feature insures that all electrical current flows in one contact member, through the current limit resister and parallel connected diodes, and out the other contact member which limits the possible current available and prevents any damage to the circuit or tester.

Various changes and modifications could be made to the invention as would be apparent to one of ordinary skill in the art in light of this disclosure. However, those changes and modifications are part of the invention which is limited only by the scope of the claims appended hereto.

What is claimed is:

1. A hand held device for testing a fuse as said fuse is mounted between a pair of fuse clips or the like, said device comprising a handle member to facilitate grasping of the device during its use, a housing member joined to said handle member, a PC board, a test circuit mounted to said PC board, means to mount said PC board within said housing, said PC board having electrically conductive contact surfaces, said test circuit having an illumination means, two contact members having electrically conductive contact surfaces, and means to mount said contact members to the housing, said PC board mounting means having means to urge said PC board contact surfaces against said contact member contact surface, at least one of said contact members being adjustably mounted to the housing to facilitate adjustment of the spacing between said contact members.

2. The device of claim 1 further comprising a fuse puller and insertion means joined to said handle member, said housing being at one end of said handle member, said fuse puller and insertion means being at the other end of said handle member.

3. The device of claim 2 wherein the fuse puller and insertion means includes a first fixture integrally formed as part of the handle member and a second fixture pivotally attached to said handle member.

4. The device of claim 3 wherein the first fixture is adapted to insert and remove blade type fuses and insert barrel type fuses and the second fixture is adapted to remove barrel type fuses.

5. The device of claim 1 wherein said adjustably mounted contact member has means to pivot with respect to the PC board.

6. The device of claim 5 wherein said second contact member is adjustably mounted to the housing and has means to be adjusted with respect to the PC board, and further comprising stop means associated with the housing to limit the adjustment of said contact members.

7. The device of claim 1 wherein the housing includes a bottom plate, the bottom plate having means to pivotally mount each contact member, said PC board mounting means including a pin and an aperture in the bottom plate, the PC board having means defining a mounting hole therethrough, each PC board contact surface having means defining a hole therethrough, and each contact member having a post so that each contact member is pivotally mounted to the bottom plate with its post extending therethrough and the PC board is mounted to the bottom plate with the pin being inserted through the mounting hole and into the aperture to thereby urge the contact member posts through the PC board contact surface holes, and the matching contact surfaces against each other.

8. The device of claim 8 further comprising stop means associated with the housing to limit the pivot angle of said contact members and prevent their contact with each other.

9. The device of claim 7 wherein the post of each of said contact members have a knurl to pivotally lock them into place on the bottom plate, the knurl forming said contact member contact surface against which is urged the PC board contact member surfaces.

10. A hand held device for testing a fuse as said fuse is mounted between a pair of fuse clips or the like, said device comprising a handle member to facilitate grasping of the device during its use, the handle having a housing member at one end and a fuse puller at its other end, a test circuit, a PC board, said test circuit being mounted to said PC board, two contact members, means to mount said PC board in said housing, means to pivotally mount said contact members in said housing, said PC board mounting means having means to urge said contact members into contact with the PC board and thereby bring them in circuit with the test circuit to thereby enable its energization while mounted therein, said test circuit having illumination means which illuminates in response to a voltage differential sensed between said contact members to thereby indicate a blown fuse.

11. The device of claim 11 wherein said handle member is made of a polycarbonate molded plastic.

12. The device of claim 10 wherein said housing includes a bottom plate, said contact members have means to snap into the bottom plate and extend therethrough, said PC board having means to mount onto said contact members, and said PC board mounting means includes a pin to mount the PC board to the bottom plate and urge it against the contact members.

13. The device of claim 10 wherein the illumination means includes a pair of light emitting diodes connected in reverse polarity.

14. The device of claim 10 wherein the fuse puller includes a first fixture integral with the handle and a second fixture pivotally attached to the handle, the first fixture being adapted for use with blade type fuses, the second fixture being adapted for use with barrel type fuses.

15. The device of claim 14 wherein the first fixture is formed at an angle to the handle.

16. The device of claim 12 wherein the bottom plate includes an integral stop means, said stop means being positioned between the contact members to physically limit the angle of rotation of each and prevent their being moved into contact with each other.

17. The device of claim 16 wherein each contact member has a nib for contacting the stop means and limiting its movement.

18. The device of claim 10 wherein the contact members are the only exposed parts of said device which are electrically conductive.

* * * * *